(12) United States Patent
Loiselet et al.

(10) Patent No.: US 8,278,559 B2
(45) Date of Patent: Oct. 2, 2012

(54) PRINTED CIRCUIT BOARD ASSEMBLY

(75) Inventors: Emmanuel Loiselet, Horsham West Sussex (GB); Phil Wills, Horsham West Sussex (GB)

(73) Assignee: Thales Holdings UK PLC, Weybridge-Surrey (GB)

( * ) Notice: Subject to any disclaimer, the term of this patent is extended or adjusted under 35 U.S.C. 154(b) by 361 days.

(21) Appl. No.: 12/492,001

(22) Filed: Jun. 25, 2009

(65) Prior Publication Data

US 2010/0000766 A1 Jan. 7, 2010

(30) Foreign Application Priority Data

Jul. 2, 2008 (GB) .................................. 0812139.4

(51) Int. Cl.
*H05K 1/00* (2006.01)
*H05K 3/36* (2006.01)
(52) U.S. Cl. ........................ 174/252; 174/260; 29/830
(58) Field of Classification Search .................. 174/260, 174/252; 361/679.56, 702, 709; 29/830
See application file for complete search history.

(56) References Cited

U.S. PATENT DOCUMENTS

| | | | |
|---|---|---|---|
| 5,856,911 A | 1/1999 | Riley | |
| 5,869,356 A * | 2/1999 | Fuller et al. | 438/126 |
| 6,265,767 B1 | 7/2001 | Gaku | |
| 6,268,239 B1 * | 7/2001 | Ikeda | 438/122 |
| 6,297,959 B1 * | 10/2001 | Ueno et al. | 361/704 |
| 6,490,161 B1 | 12/2002 | Johnson | |
| 6,917,523 B2 * | 7/2005 | Summers et al. | 361/719 |
| 2004/0171189 A1 | 9/2004 | Gaku | |
| 2004/0173901 A1 | 9/2004 | Mallik et al. | |
| 2004/0256711 A1 | 12/2004 | Sakamoto et al. | |

FOREIGN PATENT DOCUMENTS

| | | |
|---|---|---|
| EP | 1202349 | 5/2002 |
| JP | 2005-005629 | 1/2005 |
| WO | 03/090278 | 10/2003 |
| WO | 2004/112129 | 12/2004 |

* cited by examiner

*Primary Examiner* — Jeremy Norris
(74) *Attorney, Agent, or Firm* — Stroock & Stroock & Lavan LLP

(57) ABSTRACT

An assembly comprising a first printed circuit board, PCB, with a ball grid array, BGA, on its underside, a second PCB facing the first PCB and having at least one through-hole between its top and bottom surfaces, its top surface printed with a circuit pattern bonded to the BGA, a heat sink layer facing the bottom surface of the second PCB and having at least one thermally-conductive pin projecting normally into the through-hole or a respective one of the through-holes in the second PCB, and, for each pin, a thermally-conductive stud of the same cross-section as the pin, bonded to the BGA and disposed within the through-hole between the pin and the first PCB in thermal contact with the pin.

10 Claims, 3 Drawing Sheets

PRINTED CIRCUIT BOARD ASSEMBLY

CROSS-REFERENCE TO RELATED APPLICATION

The present application claims the benefit of British Patent Application No. 0812139.4, filed Jul. 2, 2008, which is hereby incorporated by reference in their entirety.

FIELD OF THE INVENTION

This invention relates to a printed circuit board, PCB, assembly and to a method of making such an assembly. It is particularly although not exclusively concerned with the use of a ball grid array, BGA, component as part of the assembly.

BACKGROUND OF THE INVENTION

Heat dissipation from printed circuit boards poses a serious problem particularly in the case of high power amplifiers: integrated circuit chips for such amplifiers can for example generate in excess of 3 W each, and for some applications such as antenna arrays with several thousand chips the power consumption can be 30 kW or more. Part of the problem lies in the high level of spatial integration using multiple layers of PCBs, since it becomes difficult to arrange for a short path length between the heat generators and the heat sinks. Excessive temperatures can permanently damage the integrated circuits.

The use of a BGA facilitates assembly of a sealed integrated circuit chip, for example, onto a printed circuit, and can allow for replacement of such a chip using soldering techniques. Thermal dissipation from such a chip is conventionally done through a set of the balls of the BGA, using thermally conductive via holes through the underlying printed circuit board, through to a heat sink which may be a metallic girder and may have a fluid cooling system running through it. However, such arrangements often have an unsatisfactory rate of thermal transfer. Accordingly, the purpose of the present invention is to overcome this limitation, so as to allow satisfactory thermal dissipation from a chip with a BGA through an underlying PCB to a heat sink.

SUMMARY OF THE INVENTION

Accordingly, the invention provides an assembly comprising a first printed circuit board, PCB, with a ball grid array, BGA, on its underside, a second PCB facing the first PCB and having at least one through-hole between its top and bottom surfaces, its top surface printed with a circuit pattern bonded to the BGA, a heat sink layer facing the bottom surface of the second PCB and having at least one thermally-conductive pin projecting normally into the through-hole or a respective one of the through-holes in the second PCB, and, for each pin, a thermally-conductive stud of the same cross-section as the pin, bonded to the BGA and disposed within the through-hole between the pin and the first PCB in thermal contact with the pin.

The use of a through-hole through the PCB means that a substantially wider conductive channel can be provided, for conveying heat from the BGA through the PCB to the heat sink underneath the PCB. The provision of the stud can ensure a satisfactory thermal interface between the BGA and the projecting pin of the heat sink. The stud also facilitates removal of the first PCB, which may be a sealed integrated circuit box, for replacement of that box, without the need to replace any other components of the assembly.

The invention also provides a method of making such an assembly, comprising locating the or each stud in a respective through-hole flush with its top surface, depositing a solder mask layer over the top surface of the second PCB and the stud or studs, placing together the second PCB and the heat sink, with the or each pin in a respective through-hole, and bonding the first PCB to the second PCB and the stud or studs using the BGA.

In order that the invention may be better understood, a preferred embodiment will now be described, with reference to the accompanying drawings, in which:

MORE DETAILED DESCRIPTION

Figure 1:
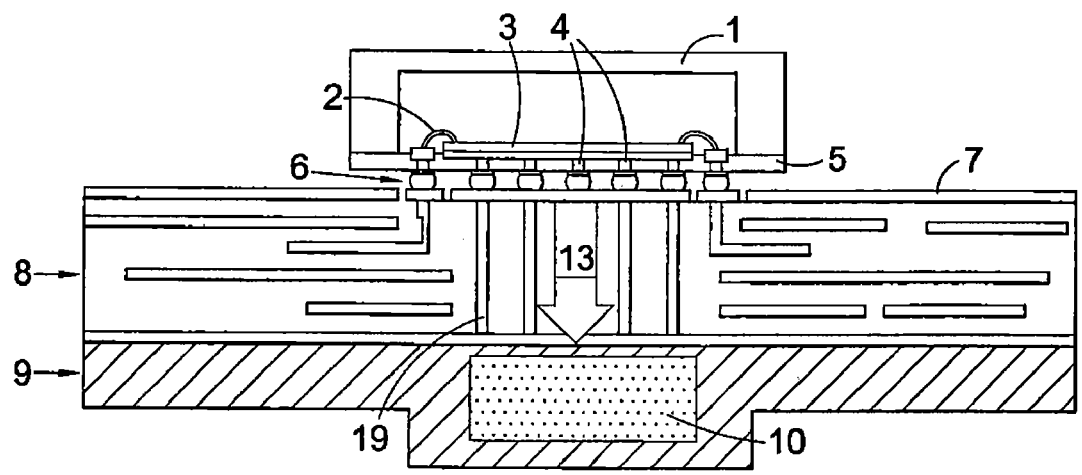
FIG. 1 (prior art) shows part of an assembly of a PCB over a heat sink layer, with a sealed integrated circuit box connected through a BGA.

Corresponding components in the different drawings are given the same reference numerals. As shown in FIG. 1, an hermetically sealed integrated circuit box 1 has for its base a PCB 5 with an array of through-holes 4 to a BGA 6 comprising solder balls, as is well known. A high power integrated circuit, such as a power amplifier 3, is mounted on the PCB 5 and external leads connect it to peripheral interconnection pads on the PCB 5. The BGA 6 is bonded with good electrical and thermal contact to a printed circuit 7 on a PCB 8 which itself is bonded to the upper surface of a metallic girder 9 which acts as a heat sink and conveys heat away from the box 1, through the BGA, to further heat sinks such as exposed fins (not shown). The heat sink 9 has an enclosed channel 10 for a fluid cooling system. Thermal transfer shown by the arrow 13 through the PCB 8 is achieved with the use of narrow vertical channels 19.

Figure 2:
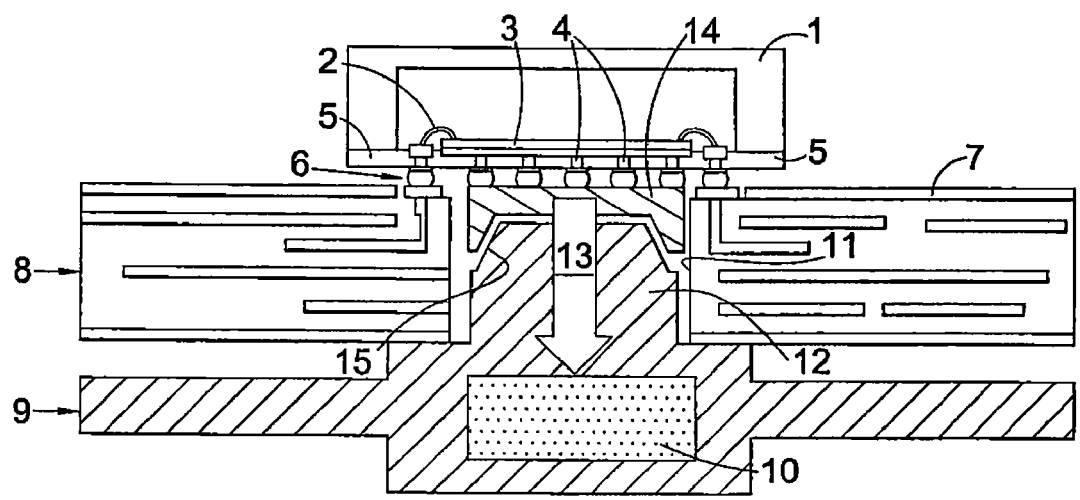
FIG. 2 is a part assembly corresponding to that of FIG. 1 but embodying the present invention.

As shown in FIG. 2, the invention provides an improved system for thermal transfer through the PCB 8. A through-hole 11 is formed in the PCB 8 in register with the BGA 6. In this example, the through-hole has a circular cross-section, although other shapes are possible. Most of the diameter of this through-hole is taken up with strongly thermally conductive material, preferable metal, to convey heat from the BGA 6 to the heat sink 9, which in this example is also a metallic girder with a fluid channel 10. The heat sink 9 has an array of normally-projecting pins 12, of which one is shown in FIG. 2, for projecting into respective through-holes such as through-hole 11. The diameter of the pin 12 is only slightly less than the internal diameter of the through-hole 11, to allow for manufacturing tolerance and assembly tolerance. In this example, the heat sink 9 is integral with pin 12 and is formed of aluminium, although of course other thermally conductive materials such as copper or brass are feasible.

A stud 14 fills most of the remaining space of the through-hole 11 and provides a good thermal interface between the pin 12 and the BGA 6. A layer of standard thermal grease (not shown) fills the narrow interface between the stud 14 and the pin 12. In this example, the stud 14 is of brass, which is compatible with the low melting point solid paste of the BGA 6, but other solderable materials are feasible, such as copper, or aluminium plated with nickel. The material of the stud 14 is selected to have a similar coefficient of thermal expansion to that of the PCB 8, to avoid thermal shock. In this example, the stud 14 has a circular cross-section.

To facilitate assembly, to allow for some manufacturing tolerance and to increase the thermal exchange area between stud 14 and pin 12, the stud 14 has a concave lower surface, which mates with a corresponding convex upper surface of the pin 12. In this example, the pin has a part conical upper surface, with the same semi-angle as a part conical surface of the underside of the stud. The central portions of the stud and the pin are flat and circular.

Figure 3:
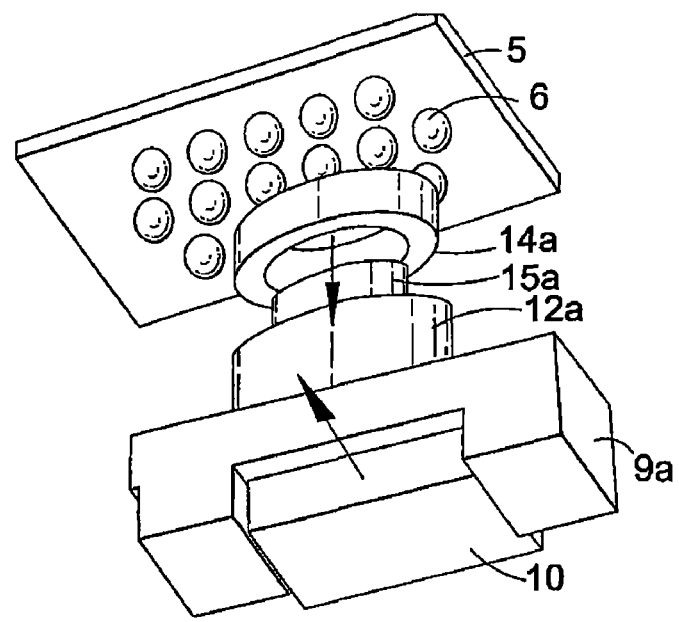
FIG. 3 is a perspective, exploded view of part of an assembly embodying the invention and corresponding to FIG. 2.

FIG. 3 shows in exploded view and in perspective a portion of an assembly embodying the invention and similar to that of FIG. 2. The heat sink 9*a* has a fluid cooling channel 10*a* and a cylindrical pin 12*a* having at its centre a conical projection 15*a* compatible with stud shape 17.

Figure 4:
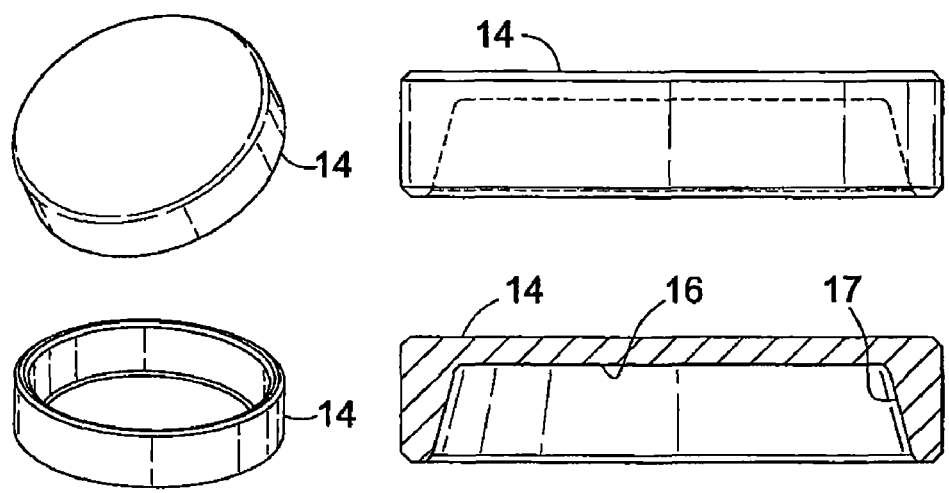
FIG. 4 shows four different views of a stud which is part of the embodiment shown in FIG. 2.

The stud 14 of FIG. 2 is shown in greater detail in the four views shown in FIG. 4. Its part conical surface 17 meets a circular, planar surface 16.

Figure 5:
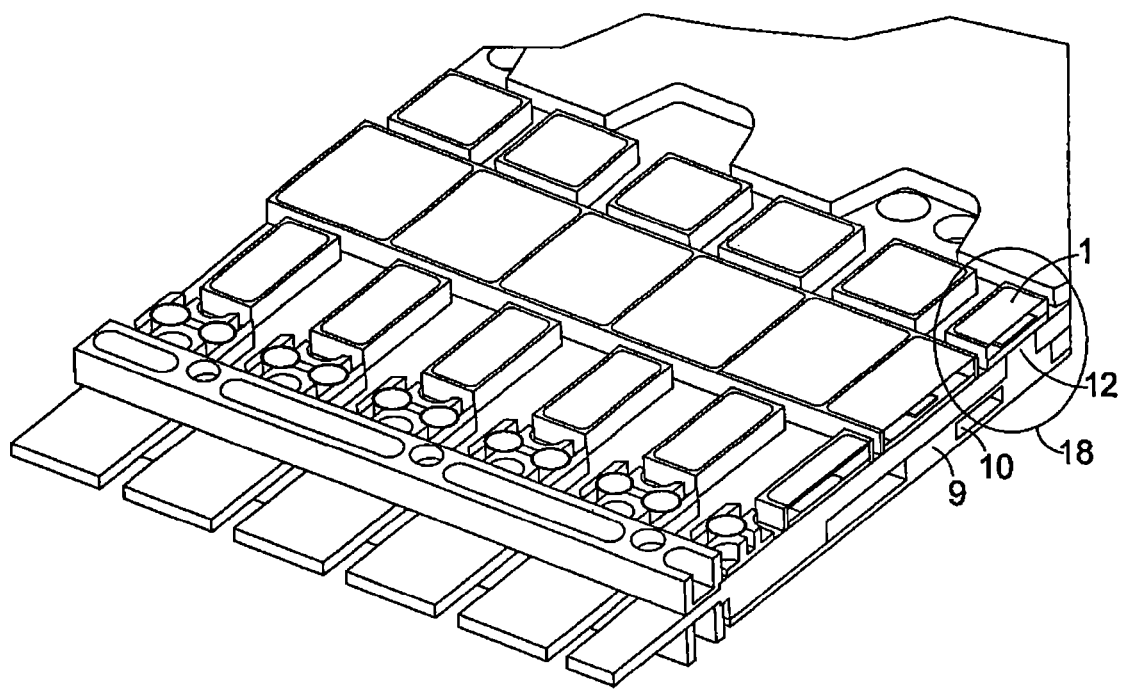
FIG. 5 is a partial perspective view of an antenna circuit assembly embodying the present invention.

Part of an active array antenna, having a transmission/receiving module, is shown in FIG. 5 in perspective view. The portion 18 of FIG. 5 corresponds broadly to the part assembly shown in FIG. 2 or FIG. 3. It will be appreciated that high power sealed components 1 can be thermally connected using a relatively short thermal path length to a heat sink 9, with the benefit of the present invention.

A method of assembly of the arrangement shown in FIGS. 2 to 5 will now be described. First, the PCB 8 is manufactured as a common multilayer board. The hole 11 in the PCB 8 and the stud 14 have tolerances to fit together either with a light press fit or else free to move. If it is such that there is free movement, then the stud 14 is adhered to the wall of the through-hole 11 flush with the first copper layer of PCB 8. Any appropriate adhesive may be used. The studs 14 are inserted into the through-holes and held by glue or friction depending on the specified tolerances. A solder mask layer is then deposited over the PCB 8 and the studs 14, and after this the various components such as the sealed box 1 are soldered in place, using respective BGAs. A small nut of thermal grease is then provided in the stud cavity 16 and 17, and then the PCB 8 is assembled adjacent the metallic girder heat sink 9, whose projecting pins are inserted through corresponding through-holes 11 and onto studs 14.

Replacement of one of the sealed boxes 1, or of another electronic component, may be undertaken after disassembly of the metallic girder heat sink 9 from the PCB 8, and after cleaning thermal grease from the stud cavity 16 and 17, by heating the BGA 6 at its periphery sufficiently to release the box 1 from the PCB 8, while the stud 14 stays attached to the PCB 8 through-hole 11. Box 1 can be removed and replaced with a new component, after having cleaned the upper side of the PCB 8 and the stud 14. A sufficiently low thermal capacity of the stud 14 is necessary for removal of the box 1 without damaging the stud 14.

It will be appreciated that transmission/receiving modules such as that shown in FIG. 5 are expensive and that replacement of individual components is desirable.

The invention claimed is:

1. An assembly comprising:
    a first printed circuit board, having a ball grid array, on an underside of the first printed circuit board;
    a second printed circuit board having a top surface and a bottom surface, the top surface facing the underside of the first printed circuit board and having at least one through-hole between its top and bottom surfaces, its top surface printed with a circuit pattern bonded to the ball grid array;
    a heat sink facing the bottom surface of the second printed circuit board and having at least one thermally-conductive pin projecting normally into the at least one through-hole, respectively, in the second printed circuit board; and
    for each thermally-conductive pin, a thermally-conductive stud formed from a solderable material of substantially the same cross-section as the thermally-conductive pin, bonded to the ball grid array and disposed within the through-hole between the thermally-conductive pin and the first printed circuit board in thermal contact with the thermally-conductive pin.

2. An assembly according to claim 1, in which the thermally-conductive stud and the thermally-conductive pin are circular in cross-section.

3. An assembly according to claim 1, in which the thermally-conductive stud has a concave surface mating with a convex surface of the thermally-conductive pin.

4. An assembly according to claim 1, in which the surfaces of the thermally-conductive stud and of the thermally-conductive pin are part-conical with a substantially same semi-angle.

5. An assembly according to claim 1, in which the stud comprises a material selected from a group consisting of brass, aluminium and copper.

6. An assembly according to claim 1, in which the stud has a thermal expansion coefficient substantially the same as a thermal expansion coefficient of the second printed circuit board.

7. An assembly according to claim 1, comprising a thermal grease at an interface between the thermally-conductive pin and the thermally-conductive stud.

8. A method of making an assembly, wherein the method comprises the steps of:
    positioning a thermally-conductive stud in a respective throughhole such that a top surface of the thermally-conductive stud is flush with a top surface of a second printed circuit board, the thermally-conductive stud made from a solderable material;
    depositing a solder mask layer over the top surface of the second printed circuit board and the thermally-conductive stud;
    placing together the second printed circuit board and a heat sink, with a thermally-conductive pin in a through-hole; and
    bonding a first printed circuit board to the second printed circuit board and the thermally-conductive stud using a ball grid array.

9. The method according to claim 8, further comprising the step of:
    applying thermal grease to the thermally-conductive stud in the respective through-hole prior to the placing together of the second printed circuit board and the heat sink, to provide a thermally conductive interface between the thermally-conductive stud and the respective thermally-conductive pin.

10. A method according to claim 8, further comprising the step of adhering the thermally-conductive stud to a wall of the respective through-hole.

\* \* \* \* \*